(12) United States Patent
Nagata et al.

(10) Patent No.: US 9,231,004 B2
(45) Date of Patent: Jan. 5, 2016

(54) SOLID-STATE IMAGING APPARATUS AND IMAGING SYSTEM

(71) Applicant: Kabushiki Kaisha Toshiba, Minato-ku (JP)

(72) Inventors: Kazuhiro Nagata, Yokohama (JP); Ninao Sato, Mitaka (JP); Katsuo Iwata, Yokohama (JP); Takayuki Ogasahawa, Yokohama (JP)

(73) Assignee: Kabushiki Kaisha Toshiba, Minato-ku (JP)

( * ) Notice: Subject to any disclaimer, the term of this patent is extended or adjusted under 35 U.S.C. 154(b) by 0 days.

(21) Appl. No.: 14/484,516

(22) Filed: Sep. 12, 2014

(65) Prior Publication Data

US 2015/0156431 A1 Jun. 4, 2015

(30) Foreign Application Priority Data

Dec. 3, 2013 (JP) ................................. 2013-250492

(51) Int. Cl.
*H01L 27/146* (2006.01)
*G02B 3/00* (2006.01)
*H04N 5/357* (2011.01)

(52) U.S. Cl.
CPC ........ *H01L 27/14601* (2013.01); *G02B 3/0043* (2013.01); *H01L 27/14605* (2013.01); *H01L 27/14627* (2013.01); *H04N 5/3572* (2013.01)

(58) Field of Classification Search
CPC ................. H04N 5/2254; H04N 5/369; H01L 27/14601; G02B 3/0037
USPC .......................................... 348/335–340, 369
See application file for complete search history.

(56) References Cited

U.S. PATENT DOCUMENTS

| 5,682,203 | A | * | 10/1997 | Kato | ................... | G02B 3/0043 |
|---|---|---|---|---|---|---|
| | | | | | | 257/E31.128 |
| 7,199,931 | B2 | | 4/2007 | Boettiger et al. | | |
| 7,227,692 | B2 | | 6/2007 | Li et al. | | |
| 7,307,788 | B2 | | 12/2007 | Boettiger et al. | | |
| 7,375,892 | B2 | * | 5/2008 | Boettiger | ......... | B29D 11/00278 |
| | | | | | | 359/619 |
| 7,428,103 | B2 | | 9/2008 | Boettiger et al. | | |
| 7,476,562 | B2 | | 1/2009 | Boettiger et al. | | |
| 7,560,295 | B2 | | 7/2009 | Boettiger et al. | | |
| 7,643,213 | B2 | | 1/2010 | Boettiger et al. | | |
| 8,274,123 | B2 | | 9/2012 | Tanaka | | |
| 8,754,493 | B2 | | 6/2014 | Tanaka | | |
| 8,795,559 | B2 | | 8/2014 | Li et al. | | |
| 2010/0091168 | A1 | * | 4/2010 | Igarashi | ............... | G02B 3/0056 |
| | | | | | | 348/340 |
| 2013/0161774 | A1 | * | 6/2013 | Okigawa | .............. | G02B 3/0056 |
| | | | | | | 257/432 |

FOREIGN PATENT DOCUMENTS

JP 2009-506383 2/2009
JP 2010-62438 3/2010

* cited by examiner

*Primary Examiner* — Tuan Ho
(74) *Attorney, Agent, or Firm* — Oblon, McClelland, Maier & Neustadt, L.L.P.

(57) ABSTRACT

According to one embodiment, there is provided a solid-state imaging apparatus having an imaging region. In the imaging region, a plurality of pixels are two-dimensionally arranged. The plurality of pixels include a first pixel and a second pixel. The first pixel is arranged near a center of the imaging region. The second pixel is arranged at a position farther away from the center of the imaging region than the first pixel. The first pixel includes a first micro lens having a substantially circular shape as viewed in a plan view. The second pixel includes a second micro lens having a substantially elliptical shape as viewed in a plan view and having an area larger than an area of the first micro lens.

16 Claims, 9 Drawing Sheets

SOLID-STATE IMAGING APPARATUS AND IMAGING SYSTEM

CROSS-REFERENCE TO RELATED APPLICATIONS

This application is based upon and claims the benefit of priority from Japanese Patent Application No. 2013-250492, filed on Dec. 3, 2013; the entire contents of which are incorporated herein by reference.

FIELD

Embodiments described herein relate generally to a solid-state imaging apparatus and an imaging system.

BACKGROUND

In an imaging system such as a camera, a solid-state imaging apparatus is arranged on a predetermined imaging plane of an imaging lens. The imaging lens forms an image of an object on an imaging region (an imaging area) of the solid-state imaging apparatus. The solid-state imaging apparatus generates an image signal corresponding to an object image. At this time, in an image signal generated by the solid-state imaging apparatus, when an amount of received light of surrounding pixels attenuates as compared with pixels near the center of the imaging region, a shading phenomenon may occur such that luminance (a signal level) of pixel signals around the imaging region attenuates as compared with that of the pixel signals near the center of the imaging region.

DETAILED DESCRIPTION

In general, according to one embodiment, there is provided a solid-state imaging apparatus having an imaging region. In the imaging region, a plurality of pixels are two-dimensionally arranged. The plurality of pixels include a first pixel and a second pixel. The first pixel is arranged near a center of the imaging region. The second pixel is arranged at a position farther away from the center of the imaging region than the first pixel. The first pixel includes a first micro lens having a substantially circular shape as viewed in a plan view. The second pixel includes a second micro lens having a substantially elliptical shape as viewed in a plan view and having an area larger than an area of the first micro lens.

Exemplary embodiments of a solid-state imaging apparatus will be explained below in detail with reference to the accompanying drawings. The present invention is not limited to the following embodiments.

Embodiment

Figure 1:
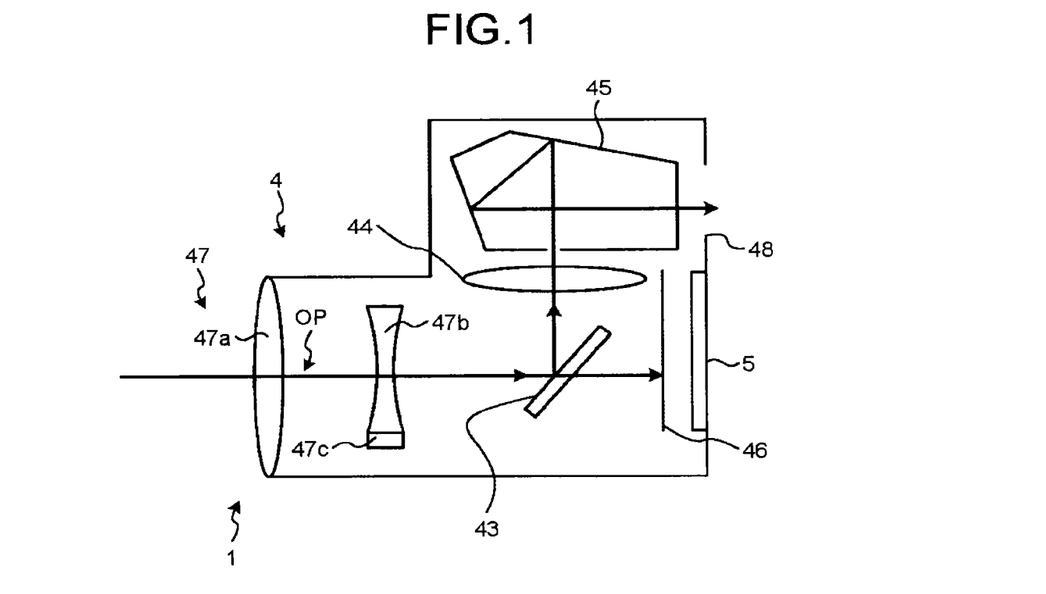
FIG. 1 illustrates a configuration of an imaging system to which a solid-state imaging apparatus according to an embodiment of the present invention is applied.
Figure 2:
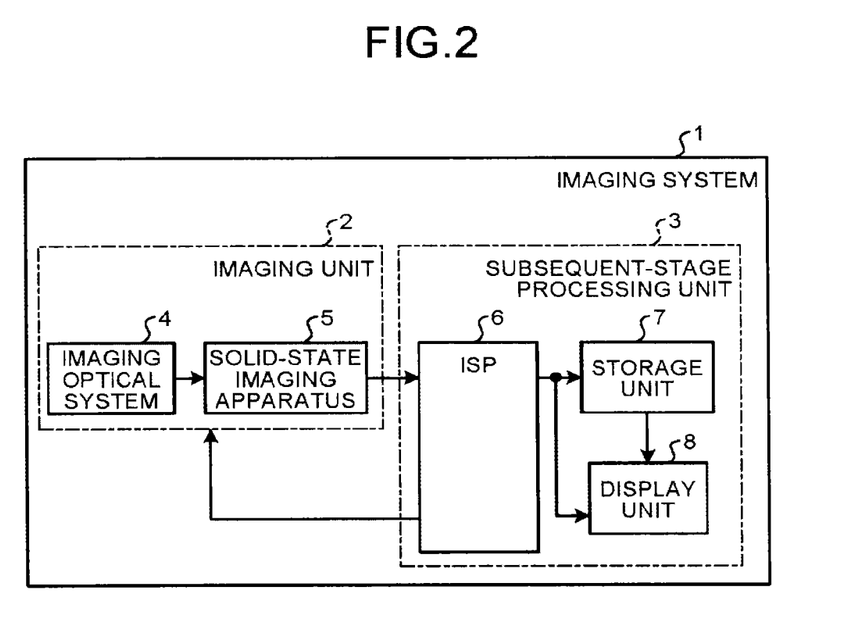
FIG. 2 illustrates the configuration of the imaging system to which the solid-state imaging apparatus according to the embodiment is applied.

A solid-state imaging apparatus according to an embodiment is explained. The solid-state imaging apparatus is applied to an imaging system shown in, for example, FIGS. 1 and 2. FIGS. 1 and 2 illustrate schematic configurations of the imaging system.

An imaging system 1 can be, for example, a digital camera or a digital video camera, or can be an imaging system in which a camera module is applied to an electronic device (for example, a mobile terminal with a camera function). As shown in FIG. 2, the imaging system 1 includes an imaging unit 2 and a subsequent-stage processing unit 3. The imaging unit 2 is, for example, a camera module. The imaging unit 2 includes an imaging optical system 4 and a solid-state imaging apparatus 5. The subsequent-stage processing unit 3 includes an image signal processor (ISP) 6, a storage unit 7, and a display unit 8.

The imaging optical system 4 includes an imaging lens 47, a half mirror 43, a mechanical shutter 46, a lens 44, a prism 45, and a finder 48. The imaging lens 47 includes imaging lenses 47a and 47b, a diaphragm (not shown), and a lens drive mechanism 47c. The diaphragm is arranged between the imaging lenses 47a and 47b to adjust the amount of light to be guided to the imaging lens 47b. In FIG. 1, a case where the imaging lens 47 includes two imaging lenses 47a and 47b is shown as an example. However, the imaging lens 47 can include a plurality of imaging lenses.

The solid-state imaging apparatus 5 is arranged on a predetermined imaging plane of the imaging lens 47. For example, the imaging lens 47 refracts incident light, and guides the light to an imaging area of the solid-state imaging apparatus 5 via the half mirror 43 and the mechanical shutter 46 to form an image of an object on the imaging area (an imaging region IR) of the solid-state imaging apparatus 5. The solid-state imaging apparatus 5 generates an image signal corresponding to an object image.

Figure 3:
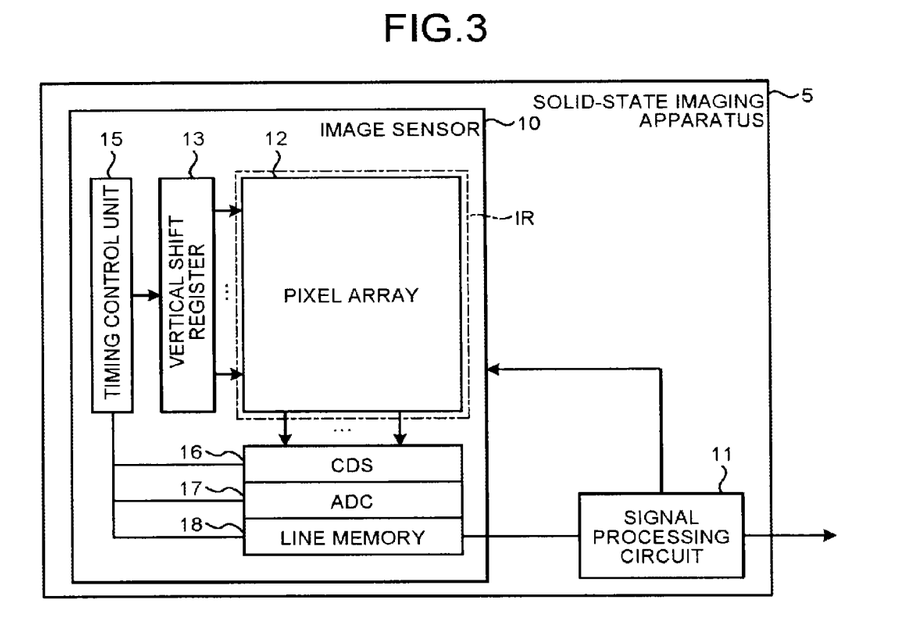
FIG. 3 illustrates a circuit configuration of the solid-state imaging apparatus according to the embodiment.

As shown in FIG. 3, the solid-state imaging apparatus 5 includes an image sensor 10 and a signal processing circuit 11. FIG. 3 illustrates a circuit configuration of the solid-state imaging apparatus. The image sensor 10 can be, for example, a CMOS image sensor or can be a CCD image sensor. The image sensor 10 includes a pixel array 12, a vertical shift register 13, a timing control unit 15, a correlation double sampling unit (CDS) 16, an analog/digital conversion unit (ADC) 17, and a line memory 18.

The pixel array 12 is arranged in the imaging region IR (see FIG. 5) in the solid-state imaging apparatus 5. For example, the imaging region IR has a rectangular shape. In the pixel array 12, a plurality of pixels P is arranged two-dimensionally. The respective pixels P include a micro lens ML and a photoelectric conversion unit. PD (see FIGS. 7A to 7C). The micro lens ML collects light incident to the pixel P, on a light receiving surface of the photoelectric conversion unit PD. The photoelectric conversion unit PD is, for example, a photodiode, and generates a pixel signal corresponding to the amount of received light. That is, the pixel array 12 generates an image signal (an analog signal) corresponding to the amount of light incident to each pixel P. The generated image signal is read from the pixel P to the CDS 16 side by the timing control unit 15 and the vertical shift register 13, is converted to an image signal (a digital signal) via the CDS 16 and the ADC 17, and is output to the signal processing circuit 11 via the line memory 18. In the signal processing circuit 11, image data is generated by performing signal processing with respect to the image signal. The generated image data is output to the ISP 6.

The lens drive mechanism 47c shown in FIG. 1 drives the imaging lens 47b along an optical axis OP under control of the ISP 6 (see FIG. 2). For example, the ISP 6 obtains focusing adjusting information according to an Auto Focus (AF) function, to control the lens drive mechanism 47c based on the focusing adjusting information, thereby adjusting the imaging lenses 47a and 47b to a focused state (just focus).

Figure 4:
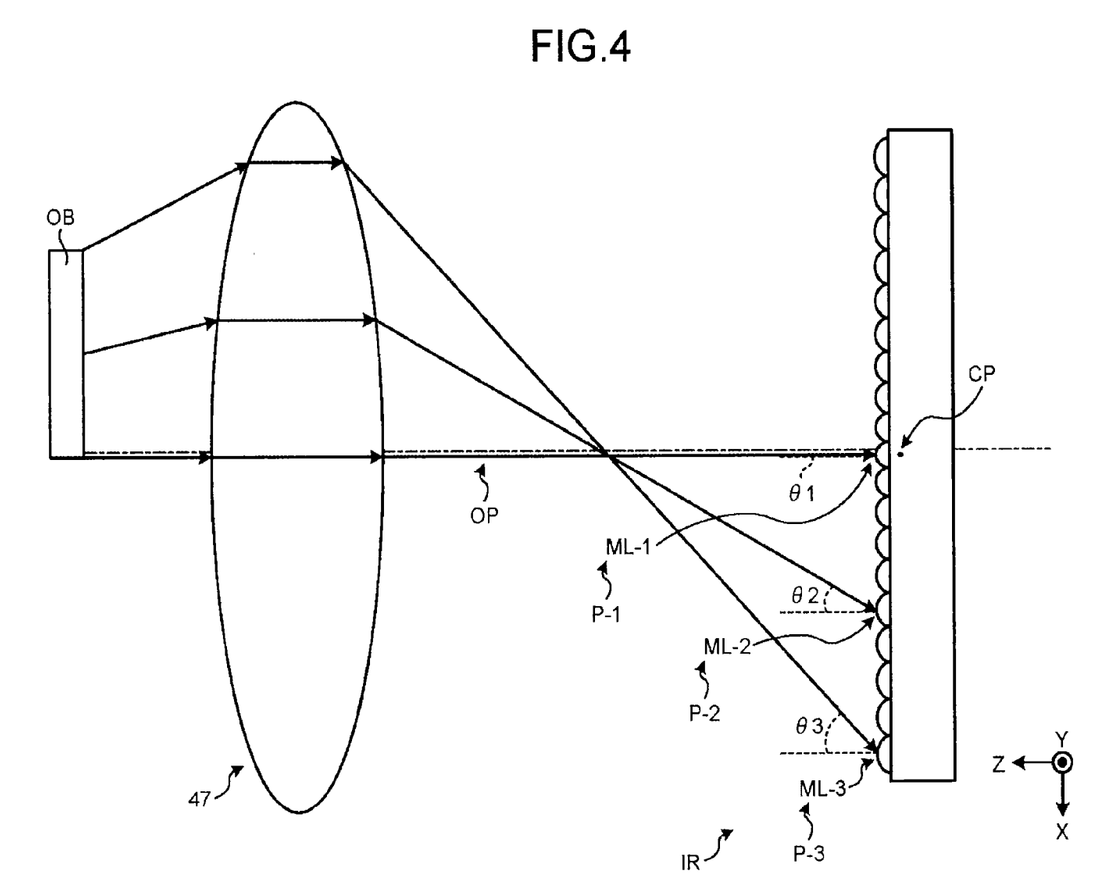
FIG. 4 illustrates an incident angle of a principal ray according to the embodiment.

An incident angle of light (a principal ray) to the respective pixels P in the imaging region IR is explained with reference to FIG. 4. FIG. 4 illustrates the incident angle of light (a principal ray) to the respective pixels P in the imaging region IR.

In FIG. 4, a direction along the optical axis OP is plotted on a Z axis, a direction along a side SD2 (see FIG. 5) of the imaging region IR is plotted on an X axis, and a direction along a side SD1 (see FIG. 5) of the imaging region IR is plotted on a Y axis.

Light reflected by an object OB is refracted by the imaging lens 47 to form an image of the object OB in the imaging region IR (an imaging area) of the solid-state imaging apparatus 5. In the imaging region IR, a plurality of pixels P is arranged two-dimensionally, and a plurality of micro lenses ML is arranged two-dimensionally corresponding thereto (see FIG. 5). At this time, when it is assumed that a point of intersection between the optical axis OP and the imaging region IR (an imaging area) is at a center CP of the imaging region, the incident angle of light to the micro lens ML of a pixel P arranged at a position away from the center CP of the imaging region IR becomes larger than the incident angle of light to the micro lens ML of a pixel P arranged near the center CP of the imaging region IR.

For example, in FIG. 4, a pixel P-1 is arranged near the center CP of the imaging region IR. A pixel P-2 is arranged at a position farther away from the center CP of the imaging region IR than the pixel P-1. Corresponding thereto, an incident angle θ2 of light to a micro lens ML-2 of the pixel P-2 becomes larger than an incident angle θ1 ($\cong 0$) of light to a micro lens ML-1 of the pixel P-1. Further, a pixel 2-3 is arranged at a position farther away from the center CP of the imaging region IR than the positions of the pixels P-1 and P-2. Corresponding thereto, an incident angle θ3 of light to a micro lens ML-3 of the pixel P-3 becomes larger than the incident angles θ1 and θ2 of light to the micro lenses ML-1 and ML-2 of the pixels P-1 and P-2. That is, in the pixels P arranged in the imaging region IR, the incident angle of light to the micro lenses ML of the pixels P increases as moving away from the center CP of the imaging region IR.

Figure 10:
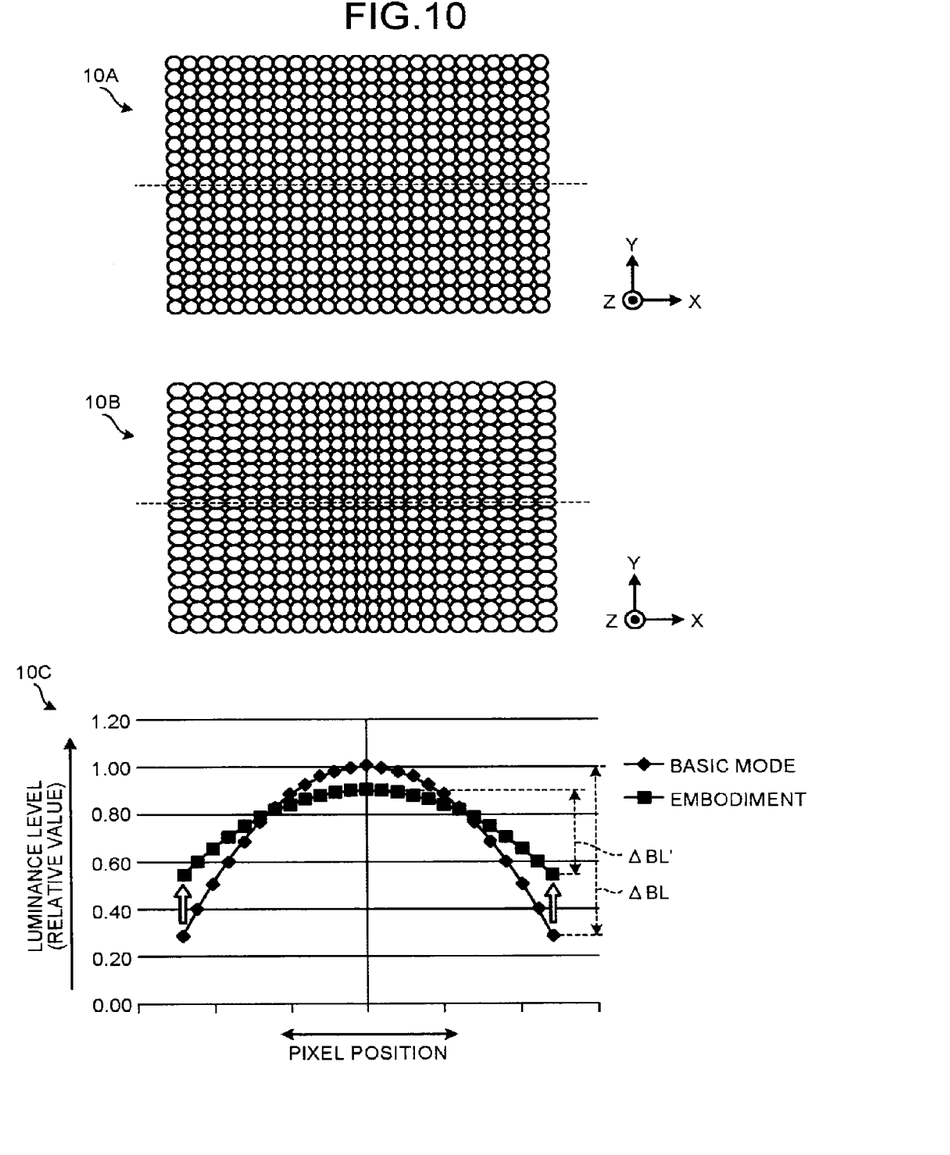
FIGS. 10A to 10C illustrate effects of the embodiment.

At this time, a configuration shown in FIG. 10A is considered, for example. FIG. 10A illustrates an array of pixels in a basic mode. In FIG. 10C, a relation between pixel positions of the pixels positioned on a broken line in FIG. 10A and a signal level (a luminance level) of the pixel signals generated in the pixels is shown as a basic mode.

As shown in FIG. 10A, when the micro lenses ML are arranged with a uniform area as viewed in a plan view in the imaging region IR, in the imaging region IR, the amount of light collected by the photoelectric conversion unit PD of the pixel P decreases as moving away from the center CP of the imaging region IR. Accordingly, as shown as the basic mode in FIG. 10C, there is a tendency such that the luminance level (a signal level) of the pixel signal generated by the photoelectric conversion unit PD of the pixel P attenuates considerably (for example, with an attenuation width ΔBL) as moving away from the center CP of the imaging region IR. As a result, in the image signal generated by the solid-state imaging apparatus 5, shading may occur in which the luminance of the pixel signals around the imaging region IR attenuates as compared with the luminance of the pixel signals near the center CP of the imaging region IR.

Therefore, in the present embodiment, it is aimed to suppress occurrence of shading by increasing the area of the micro lens ML as viewed in a plan view, as moving away from the center CP of the imaging region IR.

Figure 5:
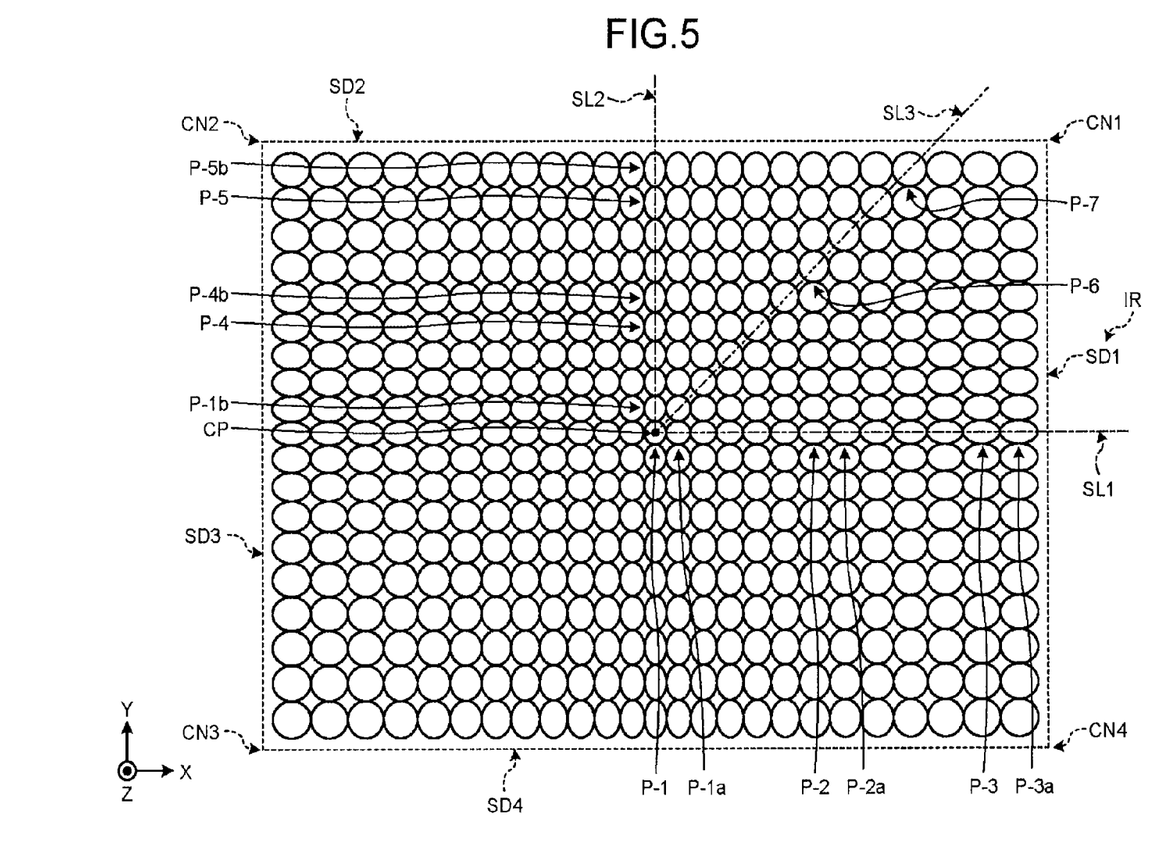
FIG. 5 illustrates an array of a plurality of pixels according to the embodiment.

Specifically, as shown in FIG. 5, the imaging region IR is, for example, in a rectangular shape. The imaging region IR has sides SD1 to SD4 and corners CN1 to CN4. The sides SD1 and SD2, the sides SD2 and SD3, the sides SD3 and SD4, and the sides SD4 and SD1 are respectively adjacent to each other. The corners CN1, CN2, CN3, and CN4 are respectively formed by an intersection of the sides SD1 and SD2, the sides SD2 and SD3, the sides SD3 and SD4, and the sides SD4 and SD1.

Figure 6:
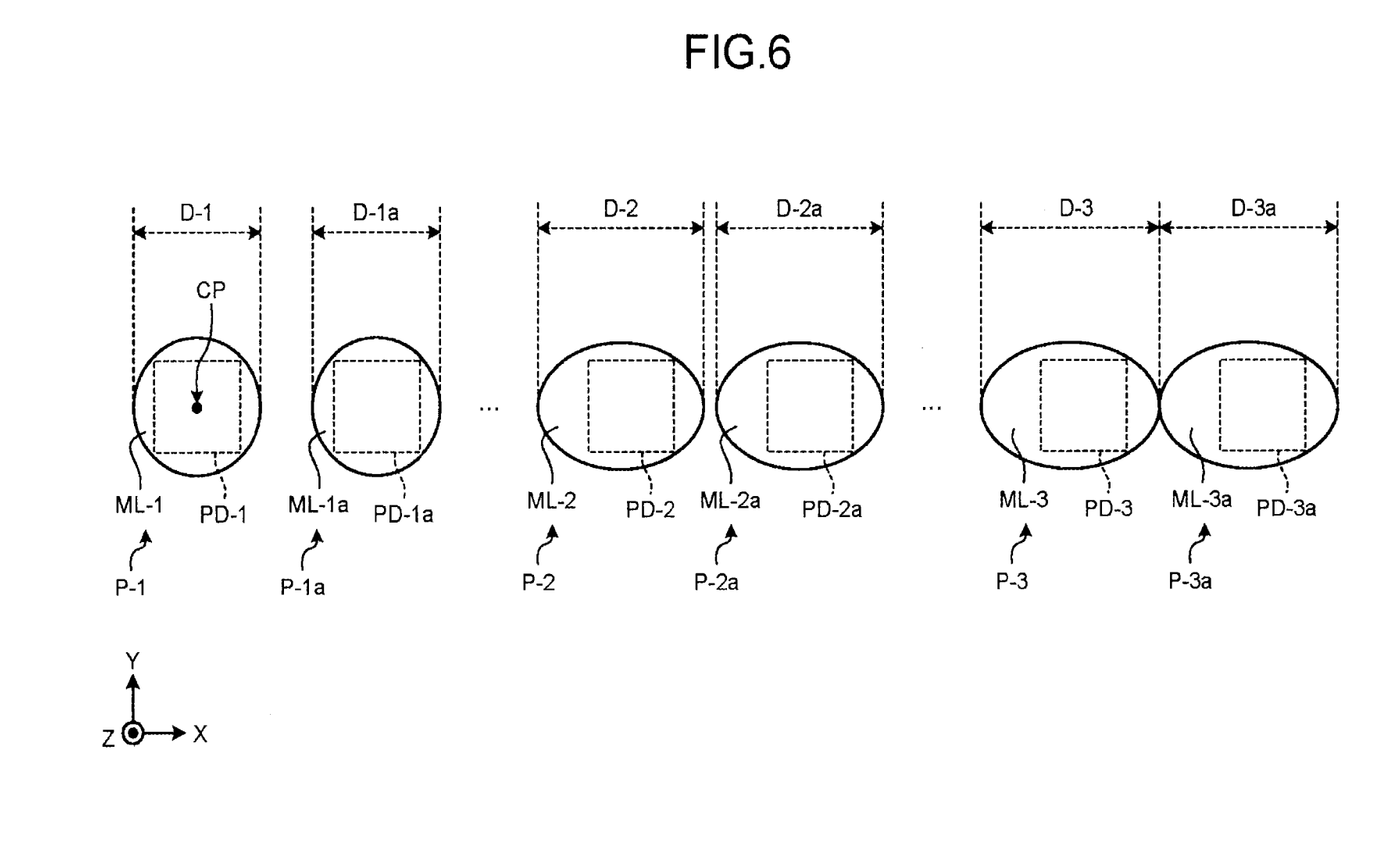
FIG. 6 is a plan view illustrating a plurality of pixels positioned on a straight line extending in an X-direction from the center of an imaging region according to the embodiment.

In the imaging region IR, as shown in FIGS. 5 and 6, in a plurality of pixels P-1, P-1a, ..., P-2, P-2a, ..., P-3, and P-3a, the shape of the micro lens ML changes from a substantially circular shape to a substantially elliptical shape extending in the X direction as moving away from the center CP of the imaging region IR. A straight line SL1 extends in the X direction from the center CP of the imaging region IR. FIG. 6 is a plan view illustrating a plurality of pixels positioned on the straight line SL1.

For example, in the pixels P-1, P-1a, ..., P-2, P-2a, ..., P-3, and P-3a positioned on the straight line SL1, along with a gradual increase in the area of the micro lens ML, a length of a major axis thereof gradually increases as moving away from the center CP of the imaging region IR.

As shown in FIG. 6, the pixel P-1 arranged near the center CP of the imaging region IR has a photoelectric conversion unit PD-1 and the micro lens ML-1. As viewed perspectively from a direction vertical to the light-receiving surface of the photoelectric conversion unit PD-1, the micro lens ML-1 includes the photoelectric conversion unit PD-1. The micro lens ML-1 has a substantially circular shape as viewed in a plan view. For example, as viewed perspectively from the direction vertical to a light-receiving surface of the photoelectric conversion unit PD-1, the center of an optical axis of the micro lens ML-1 can be matched with a barycenter of the photoelectric conversion unit PD-1.

Figure 7:
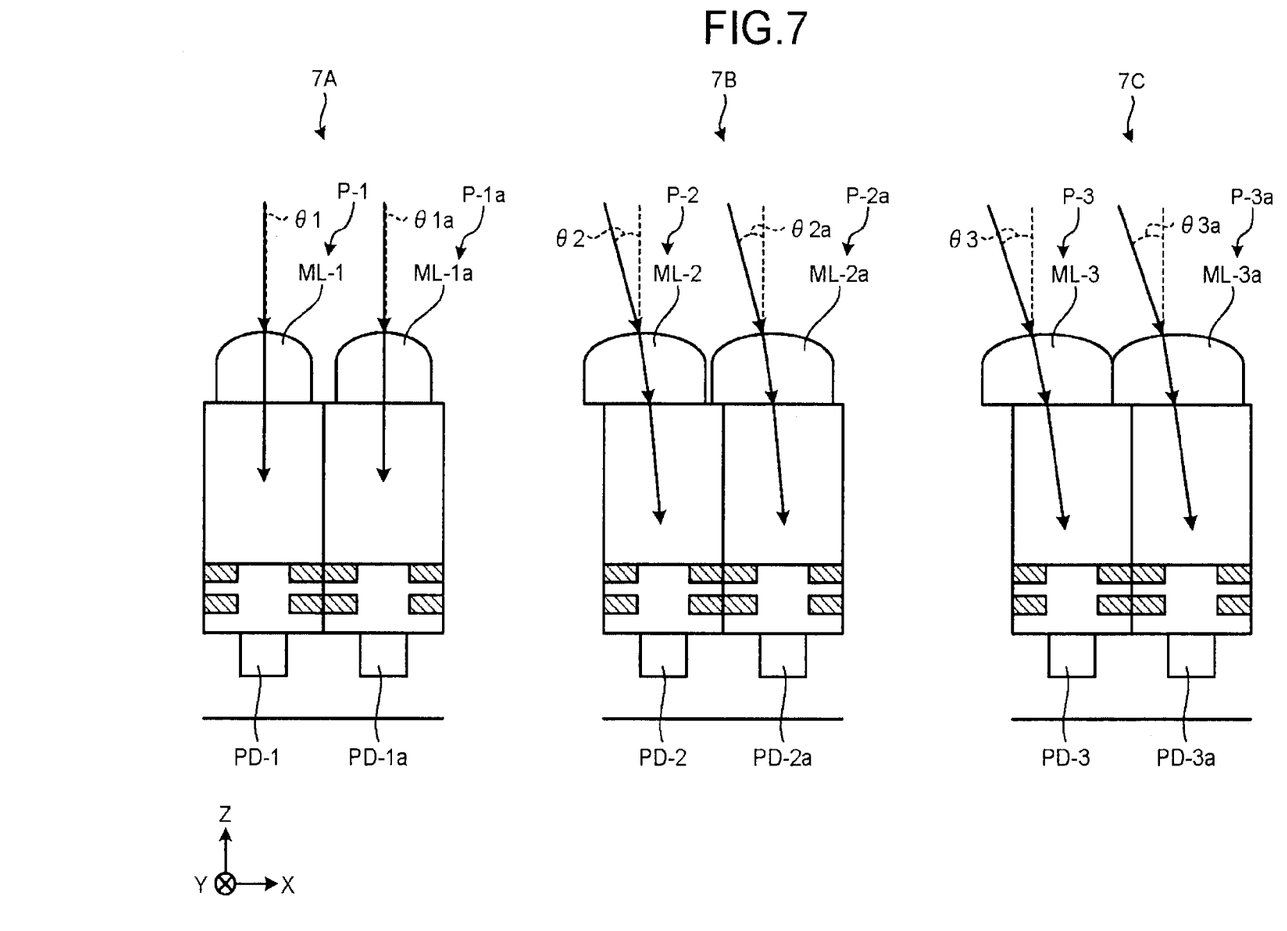
FIGS. 7A to 7C are sectional views illustrating the pixels positioned on the straight line extending in the X-direction from the center of the imaging region according to the embodiment.

At this time, as shown in FIG. 7A, light to be incident to the pixel P-1 (a principal ray) has the incident angle θ1$\cong$0 (see FIG. 4), and enters the micro lens ML-1 from the direction substantially vertical to the light-receiving surface of the photoelectric conversion unit PD-1. Accordingly, the micro lens ML-1 can easily collect incident light on the light-receiving surface of the photoelectric conversion unit PD-1. FIGS. 7A to 7C are sectional views illustrating the pixels positioned on the straight line SL1.

The pixel P-1a that is adjacent to the pixel P-1 on the straight line SL1 has a photoelectric conversion unit PD-1a and a micro lens ML-1a. As viewed perspectively from a direction vertical to a light-receiving surface of the photoelectric conversion unit PD-1a, the micro lens ML-1a includes the photoelectric conversion unit PD-1a. The micro lens ML-1a has an approximately circular shape as viewed in a plan view; however, has a substantially elliptical shape slightly extending along the side SD2. That is, the micro lens ML-1a has a substantially elliptical shape obtained by slightly extending the shape of the micro lens ML-1 toward the center CP, based on the shape of the micro lens ML-1. When it is assumed that a diameter of the micro lens ML-1 is D-1 and a length of a major axis of the micro lens ML-1a is D-1a, the following Expression 1 is established. A length of a minor axis of the micro lens ML-1a can be equal to the diameter D-1 of the micro lens ML-1.

$$D\text{-}1a > D\text{-}1 \qquad \text{Expression 1}$$

For example, as viewed perspectively from the direction vertical to the light-receiving surface of the photoelectric conversion unit PD-1a, the center of the optical axis of the micro lens ML-1a can be slightly shifted toward the center CP from the barycenter of the photoelectric conversion unit PD-1a.

At this time, as shown in FIG. 7A, light to be incident to the pixel P-1a (a principal ray) has an incident angle $\theta 1a$ ($>\theta 1$), and enters the micro lens ML-1a with an angle slightly inclined from the direction substantially vertical to the light-receiving surface of the photoelectric conversion unit PD-1a. According to Expression 1, the center of the optical axis of the micro lens ML-1a is slightly shifted toward the center CP. Therefore, the micro lens ML-1a can easily collect incident light, which is incident thereto with a slight inclination, on the light-receiving surface of the photoelectric conversion unit PD-1a. Further, because the micro lens ML-1a has a larger area than the micro lens ML-1, the amount of received light can be easily secured.

The pixel P-2 arranged at a position farther away from the center CP than the pixels P-1 and P-1a on the straight line SL1 has a photoelectric conversion unit PD-2 and a micro lens ML-2. As viewed perspectively from a direction vertical to a light-receiving surface of the photoelectric conversion unit PD-2, the micro lens ML-2 includes the photoelectric conversion unit. PD-2. The micro lens ML-2 has a substantially elliptical shape extending along the side SD2 as viewed in a plan view. That is, the micro lens ML-2 has a substantially elliptical shape obtained by extending the shape of the micro lens ML-1 further toward the center CP than the micro lens ML-1a, based on the shape of the micro lens ML-1. When it is assumed that a length of a major axis of the micro lens ML-2 is D-2, the following Expression 2 is established. A length of a minor axis of the micro lens ML-2 can be equal to the diameter D-1 of the micro lens ML-1.

$$D\text{-}2 > D\text{-}1a \qquad \text{Expression 2}$$

For example, as viewed perspectively from the direction vertical to the light-receiving surface of the photoelectric conversion unit PD-2, the center of the optical axis of the micro lens ML-2 can be shifted further toward the center CP from the barycenter of the photoelectric conversion unit PD-2, as compared with the pixel P-1a. When it is assumed that a shift amount of the center of the optical axis of the micro lens ML-1a from the barycenter of the photoelectric conversion unit PD-1a is SF1a, and a shift amount of the center of the optical axis of the micro lens ML-2 from the barycenter of the photoelectric conversion unit PD-2 is SF2, the following Expression 3 is established.

$$SF2 > SF1a \qquad \text{Expression 3}$$

At this time, as shown in FIG. 7B, light to be incident to the pixel P-2 (a principal ray) has the incident angle $\theta 2$ ($>\theta 1a>\theta$) (see FIG. 4), and enters the micro lens ML-2 with an angle inclined from the direction substantially vertical to the light-receiving surface of the photoelectric conversion unit PD-2. According to Expression 3, the center of the optical axis of the micro lens ML-2 is shifted toward the center CP. Therefore, the micro lens ML-2 can easily collect incident light, which is incident obliquely, on the light-receiving surface of the photoelectric conversion unit PD-2. Further, because the micro lens ML-2 has a larger area than the micro lenses ML-1 and ML-1a, the amount of received light can be easily secured.

The pixel P-2a that is adjacent to the pixel P-2 on the straight line SL1 has a photoelectric conversion unit PD-2a and a micro lens ML-2a. As viewed perspectively from a direction vertical to a light-receiving surface of the photoelectric conversion unit PD-2a, the micro lens ML-2a includes the photoelectric conversion unit PD-2a. The micro lens ML-2a has a substantially elliptical shape extending along the side SD2 as viewed in a plan view. That is, the micro lens ML-2a has a substantially elliptical shape obtained by extending the shape of the micro lens ML-1 further toward the center CP than the micro lens ML-2, based on the shape of the micro lens ML-1. When it is assumed that a length of a major axis of the micro lens ML-2a is D-2a, the following Expression 4 is established. A length of a minor axis of the micro lens ML-2a can be equal to the diameter D-1 of the micro lens ML-1.

$$D\text{-}2a > D\text{-}2 \qquad \text{Expression 4}$$

For example, as viewed perspectively from the direction vertical to the light-receiving surface of the photoelectric conversion unit PD-2a, the center of the optical axis of the micro lens ML-2a can be shifted further toward the center CP from the barycenter of the photoelectric conversion unit PD-2a, as compared with the pixel P-2. When it is assumed that a shift amount of the center of the optical axis of the micro lens ML-2a from the barycenter of the photoelectric conversion unit PD-2a is SF2a, the following Expression 5 is established.

$$SF2a > SF2 \qquad \text{Expression 5}$$

At this time, as shown in FIG. 7B, light to be incident to the pixel P-2a (a principal ray) has an incident angle $\theta 2a$ ($>\theta 2$), and enters the micro lens ML-2a with an angle inclined from the direction substantially vertical to the light-receiving surface of the photoelectric conversion unit PD-2a. According to Expression 5, the center of the optical axis of the micro lens ML-2a is shifted toward the center CP. Therefore, the micro lens ML-2a can easily collect incident light, which is incident obliquely, on the light-receiving surface of the photoelectric conversion unit PD-2a. Further, because the micro lens ML-2a has a larger area than the micro lenses ML-1 to ML-2, the amount of received light can be easily secured.

The pixel P-3 arranged at a position farther away from the center CP than the pixels P-2 and P-2a on the straight line SL1 has a photoelectric conversion unit PD-3 and a micro lens ML-3. As viewed perspectively from a direction vertical to a light-receiving surface of the photoelectric conversion unit PD-3, the micro lens ML-3 includes the photoelectric conversion unit PD-3. The micro lens ML-3 has a substantially elliptical shape extending along the side SD2 as viewed in a plan view. That is, the micro lens ML-3 has a substantially elliptical shape obtained by extending the shape of the micro lens ML-1 further toward the center CP than the micro lens ML-2a, based on the shape of the micro lens ML-1. When it is assumed that a length of a major axis of the micro lens ML-3 is D-3, the following Expression 6 is established. A length of a minor axis of the micro lens ML-3 can be equal to the diameter D-1 of the micro lens ML-1.

$$D\text{-}3 > D\text{-}2a \qquad \text{Expression 6}$$

For example, as viewed perspectively from the direction vertical to the light-receiving surface of the photoelectric conversion unit PD-3, the center of the optical axis of the micro lens ML-3 can be shifted further toward the center CP from the barycenter of the photoelectric conversion unit PD-3, as compared with the pixel P-2a. When it is assumed that a shift amount of the center of the optical axis of the micro lens ML-3 from the barycenter of the photoelectric conversion unit. PD-3 is SF3, the following Expression 7 is established.

$$SF3 > SF2a \qquad \text{Expression 7}$$

At this time, as shown in FIG. 7C, light to be incident to the pixel P-3 (a principal ray) has the incident angle θ3 (>θ2a>θ2) (see FIG. 4), and enters the micro lens ML-3 with an angle inclined from the direction substantially vertical to the light-receiving surface of the photoelectric conversion unit PD-3. According to Expression 7, the center of the optical axis of the micro lens ML-3 is shifted toward the center CP. Therefore, the micro lens ML-3 can easily collect incident light, which is incident obliquely, on the light-receiving surface of the photoelectric conversion unit PD-3. Further, because the micro lens ML-3 has a larger area than the micro lenses ML-1 to ML-2a, the amount of received light can be easily secured.

The pixel P-3a that is adjacent to the pixel P-3 on the straight line SL1 has a photoelectric conversion unit PD-3a and a micro lens ML-3a. As viewed perspectively from a direction vertical to a light-receiving surface of the photoelectric conversion unit PD-3a, the micro lens ML-3a includes the photoelectric conversion unit PD-3a. The micro lens ML-3a has a substantially elliptical shape extending along the side SD2 as viewed in a plan view. That is, the micro lens ML-3a has a substantially elliptical shape obtained by extending the shape of the micro lens ML-1 further toward the center CP than the micro lens ML-3, based on the shape of the micro lens ML-1. When it is assumed that a length of a major axis of the micro lens ML-3a is D-3a, the following Expression 8 is established. A length of a minor axis of the micro lens ML-3a can be equal to the diameter D-1 of the micro lens ML-1.

$$D\text{-}3a > D\text{-}3 \qquad \text{Expression 8}$$

For example, as viewed perspectively from the direction vertical to the light-receiving surface of the photoelectric conversion unit PD-3a, the center of the optical axis of the micro lens ML-3a can be shifted further toward the center CP from the barycenter of the photoelectric conversion unit PD-3a, as compared with the pixel P-3. When it is assumed that a shift amount of the center of the optical axis of the micro lens ML-3a from the barycenter of the photoelectric conversion unit PD-3a is SF3a, the following Expression 9 is established.

$$SF3a > SF3 \qquad \text{Expression 9}$$

At this time, as shown in FIG. 7C, light to be incident to the pixel P-3a (a principal ray) has an incident angle θ3a (>θ3), and enters the micro lens ML-3a with an angle inclined from the direction substantially vertical to the light-receiving surface of the photoelectric conversion unit PD-3a. According to Expression 9, the center of the optical axis of the micro lens ML-3a is shifted toward the center CP. Therefore, the micro lens ML-3a can easily collect incident light, which is incident obliquely, on the light-receiving surface of the photoelectric conversion unit PD-3a. Further, because the micro lens ML-3a has a larger area than the micro lenses ML-1 to ML-3, the amount of received light can be easily secured.

Figure 8:
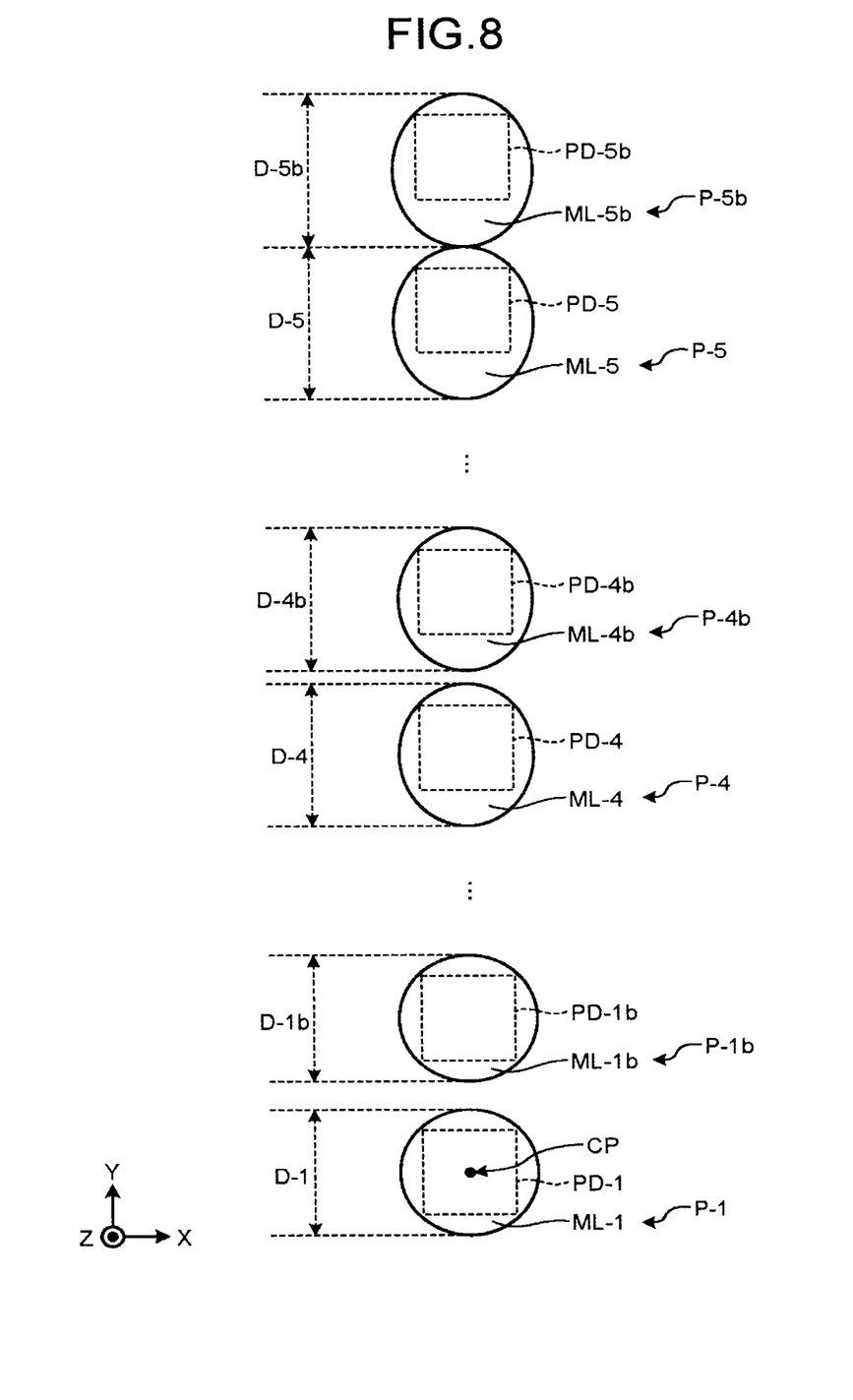
FIG. 8 is a plan view illustrating a plurality of pixels positioned on a straight line extending in a Y-direction from the center of the imaging region according to the embodiment.

In the imaging region IR, as shown in FIGS. 5 and 8, in a plurality of pixels P-1, P-1b, ..., P-4, P-4b, ..., P-5, and P-5b positioned on a straight line SL2, the shape of the micro lens ML changes from a substantially circular shape to a substantially elliptical shape extending in the Y direction as moving away from the center CP of the imaging region IR. The straight line SL2 extends in the Y direction from the center CP of the imaging region IR. FIG. 8 is a plan view illustrating the pixels positioned on the straight line SL2.

For example, in the pixels P-1, P-1b, ..., P-4, P-4b, ..., P-5, and P-5b positioned on the straight line SL2, along with a gradual increase in the area of the micro lens ML, the major axis thereof gradually increases as moving away from the center CP of the imaging region IR.

The pixel P-1b that is adjacent to the pixel P-1 on the straight line SL2 has a photoelectric conversion unit PD-1b and a micro lens ML-1b. As viewed perspectively from a direction vertical to a light-receiving surface of the photoelectric conversion unit PD-1b, the micro lens ML-1b includes the photoelectric conversion unit PD-1b. The micro lens ML-1b has an approximately circular shape as viewed in a plan view; however, has a substantially elliptical shape slightly extending along the side SD1. That is, the micro lens ML-1b has a substantially elliptical shape obtained by slightly extending the shape of the micro lens ML-1 toward the center CP, based on the shape of the micro lens ML-1. When it is assumed that the diameter of the micro lens ML-1 is D-1 and a length of a major axis of the micro lens ML-1b is D-1b, the following Expression 10 is established. A length of a minor axis of the micro lens ML-1b can be equal to the diameter D-1 of the micro lens ML-1.

$$D\text{-}1b > D\text{-}1 \qquad \text{Expression 10}$$

For example, as viewed perspectively from the direction vertical to the light-receiving surface of the photoelectric conversion unit PD-1b, the center of the optical axis of the micro lens ML-1b can be slightly shifted toward the center CP from the barycenter of the photoelectric conversion unit PD-1b. Accordingly, the micro lens ML-1b can easily collect incident light on the light-receiving surface of the photoelectric conversion unit PD-1b. Further, because the micro lens ML-1b has a larger area than the micro lens ML-1, the amount of received light can be easily secured.

The pixel P-4 arranged at a position farther away from the center CP than the pixels P-1 and P-1b on the straight line SL2 has a photoelectric conversion unit PD-4 and a micro lens ML-4. As viewed perspectively from a direction vertical to a light-receiving surface of the photoelectric conversion unit PD-4, the micro lens ML-4 includes the photoelectric conversion unit PD-4. The micro lens ML-4 has a substantially elliptical shape extending along the side SD1 as viewed in a plan view. That is, the micro lens ML-4 has a substantially elliptical shape obtained by extending the shape of the micro lens ML-1 further toward the center CP than the micro lens ML-1b, based on the shape of the micro lens ML-1. When it is assumed that a length of a major axis of the micro lens ML-4 is D-4, the following Expression 11 is established. A length of a minor axis of the micro lens ML-4 can be equal to the diameter D-1 of the micro lens ML-1.

$$D\text{-}4 > D\text{-}1b \qquad \text{Expression 11}$$

For example, as viewed perspectively from the direction vertical to the light-receiving surface of the photoelectric conversion unit PD-4, the center of the optical axis of the micro lens ML-4 can be shifted further toward the center CP from the barycenter of the photoelectric conversion unit PD-4, as compared with the pixel P-1$b$. When it is assumed that a shift amount of the center of the optical axis of the micro lens ML-1$b$ from the barycenter of the photoelectric conversion unit PD-1$b$ is SF1$b$, and a shift amount of the center of the optical axis of the micro lens ML-4 from the barycenter of the photoelectric conversion unit PD-4 is SF4, the following Expression 12 is established.

$$SF4 > SF1b \qquad \text{Expression 12}$$

According to Expression 12, the center of the optical axis of the micro lens ML-4 is shifted toward the center CP. Therefore, the micro lens ML-4 can easily collect incident light, which is incident obliquely, on the light-receiving surface of the photoelectric conversion unit PD-4. Further, because the micro lens ML-4 has a larger area than the micro lenses ML-1 and ML-1$b$, the amount of received light can be easily secured.

The pixel P-4$b$ that is adjacent to the pixel P-4 on the straight line SL2 has a photoelectric conversion unit PD-4$b$ and a micro lens ML-4$b$. As viewed perspectively from a direction vertical to a light-receiving surface of the photoelectric conversion unit PD-4$b$, the micro lens ML-4$b$ includes the photoelectric conversion unit PD-4$b$. The micro lens ML-4$b$ has a substantially elliptical shape extending along the side SD1 as viewed in a plan view. That is, the micro lens ML-4$b$ has a substantially elliptical shape obtained by extending the shape of the micro lens ML-1 further toward the center CP than the micro lens ML-4, based on the shape of the micro lens ML-1. When it is assumed that a length of a major axis of the micro lens ML-4$b$ is D-4$b$, the following Expression 13 is established. A length of a minor axis of the micro lens ML-4$b$ can be equal to the diameter. D-1 of the micro lens ML-1.

$$D\text{-}4b > D\text{-}4 \qquad \text{Expression 13}$$

For example, as viewed perspectively from the direction vertical to the light-receiving surface of the photoelectric conversion unit PD-4$b$, the center of the optical axis of the micro lens ML-4$b$ can be shifted further toward the center CP from the barycenter of the photoelectric conversion unit PD-4$b$, as compared with the pixel P-4. When it is assumed that a shift amount of the center of the optical axis of the micro lens ML-4$b$ from the barycenter of the photoelectric conversion unit PD-4$b$ is SF4$b$, the following Expression 14 is established.

$$SF4b > SF4 \qquad \text{Expression 14}$$

According to Expression 14, the center of the optical axis of the micro lens ML-4$b$ is shifted toward the center CP. Therefore, the micro lens ML-4$b$ can easily collect incident light, which is incident obliquely, on the light-receiving surface of the photoelectric conversion unit PD-4$b$. Further, because the micro lens ML-4$b$ has a larger area than the micro lenses ML-1 to ML-4, the amount of received light can be easily secured.

The pixel P-5 arranged at a position farther away from the center CP than the pixels P-4 and P-4$b$ on the straight line SL2 has a photoelectric conversion unit PD-5 and a micro lens ML-5. As viewed perspectively from a direction vertical to a light-receiving surface of the photoelectric conversion unit PD-5, the micro lens ML-5 includes the photoelectric conversion unit PD-5. The micro lens ML-5 has a substantially elliptical shape extending along the side SD1 as viewed in a plan view. That is, the micro lens ML-5 has a substantially elliptical shape obtained by extending the shape of the micro lens ML-1 further toward the center CP than the micro lens ML-4$b$, based on the shape of the micro lens ML-1. When it is assumed that a length of a major axis of the micro lens ML-5 is D-5, the following Expression 15 is established. A length of a minor axis of the micro lens ML-5 can be equal to the diameter D-1 of the micro lens ML-1.

$$D\text{-}5 > D\text{-}4b \qquad \text{Expression 15}$$

For example, as viewed perspectively from the direction vertical to the light-receiving surface of the photoelectric conversion unit PD-5, the center of the optical axis of the micro lens ML-5 can be shifted further toward the center CP from the barycenter of the photoelectric conversion unit PD-5, as compared with the pixel P-4$b$. When it is assumed that a shift amount of the center of the optical axis of the micro lens ML-5 from the barycenter of the photoelectric conversion unit PD-5 is SF5, the following Expression 16 is established.

$$SF5 > SF4b \qquad \text{Expression 16}$$

According to Expression 16, the center of the optical axis of the micro lens ML-5 is shifted toward the center CP. Therefore, the micro lens ML-5 can easily collect incident light, which is incident obliquely, on the light-receiving surface of the photoelectric conversion unit PD-5. Further, because the micro lens ML-5 has a larger area than the micro lenses ML-1 to ML-4$b$, the amount of received light can be easily secured.

The pixel P-5$b$ that is adjacent to the pixel P-5 on the straight line SL2 has a photoelectric conversion unit PD-5$b$ and a micro lens ML-5$b$. As viewed perspectively from a direction vertical to a light-receiving surface of the photoelectric conversion unit PD-5$b$, the micro lens ML-5$b$ includes the photoelectric conversion unit PD-5$b$. The micro lens ML-5$b$ has a substantially elliptical shape extending along the side SD1 as viewed in a plan view. That is, the micro lens ML-5$b$ has a substantially elliptical shape obtained by extending the shape of the micro lens ML-1 further toward the center CP than the micro lens ML-5, based on the shape of the micro lens ML-1. When it is assumed that a length of a major axis of the micro lens ML-5$b$ is D-5$b$, the following Expression 17 is established. A length of a minor axis of the micro lens ML-5$b$ can be equal to the diameter D-1 of the micro lens ML-1.

$$D\text{-}5b > D\text{-}5 \qquad \text{Expression 17}$$

For example, as viewed perspectively from the direction vertical to the light-receiving surface of the photoelectric conversion unit PD-5$b$, the center of the optical axis of the micro lens ML-5$b$ can be shifted further toward the center CP from the barycenter of the photoelectric conversion unit PD-5$b$ as compared with the pixel P-5. When it is assumed that a shift amount of the center of the optical axis of the micro lens ML-5$b$ from the barycenter of the photoelectric conversion unit PD-5$b$ is SF5$b$, the following Expression 18 is established.

$$SF5b > SF5 \qquad \text{Expression 18}$$

According to Expression 18, the center of the optical axis of the micro lens ML-5$b$ is shifted toward the center CP. Therefore, the micro lens ML-5$b$ can easily collect incident light, which is incident obliquely, on the light-receiving surface of the photoelectric conversion unit PD-5$b$. Further, because the micro lens ML-5$b$ has a larger area than the micro lenses ML-1 to ML-5, the amount of received light can be easily secured.

Figure 9:
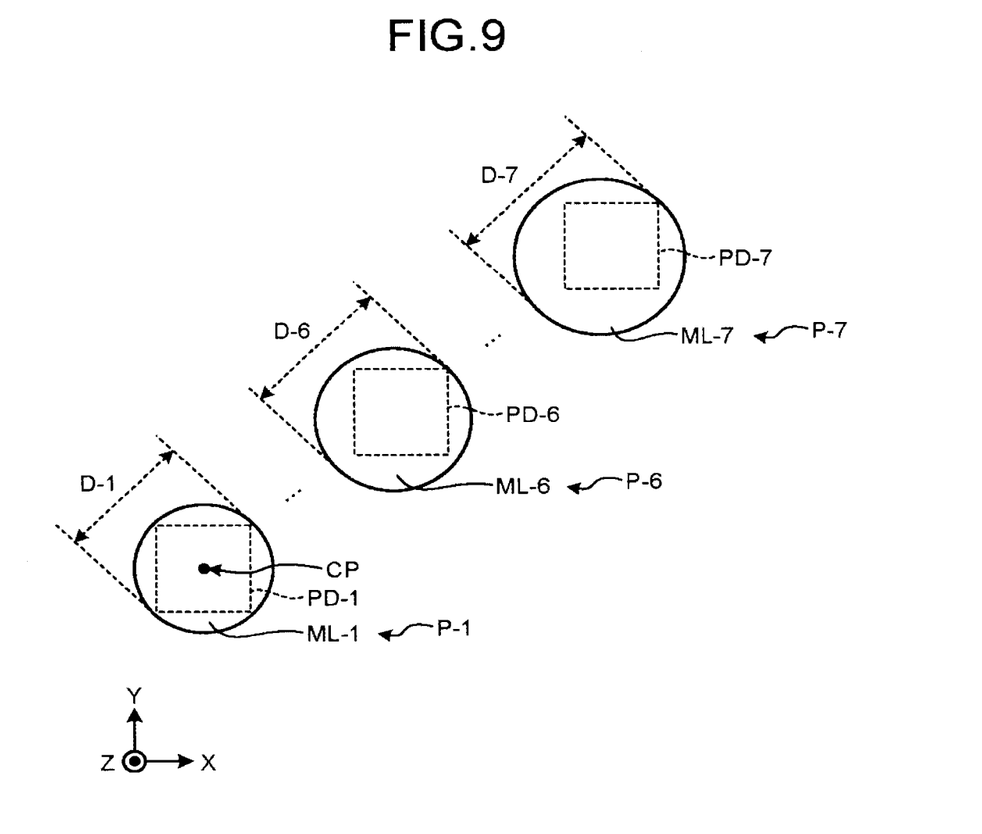
FIG. 9 is a plan view illustrating a plurality of pixels positioned on a straight line extending in an oblique direction from the center of the imaging region according to the embodiment.

In the imaging region IR, as shown in FIGS. 5 and 9, in a plurality of pixels P-1, ..., P-6, ..., and P-7 positioned on a straight line SL3, the shape of the micro lens ML changes to a shape extending in the X direction and the Y direction as moving away from the center CP of the imaging region IR, while maintaining the shape of the micro lens ML in a substantially circular shape. The straight line SL3 extends in a direction intersecting with the X direction and the Y direction (for example, a direction toward the corner CN1) from the center CP of the imaging region IR, and extends along pixels with pixel positions thereof in the X direction and the Y direction being equal. FIG. 9 is a plan view illustrating the pixels positioned on the straight line SL3.

For example, in the pixels P-1, . . . , P-6, . . . , and P-7 positioned on the straight line SL3, along with a gradual increase in the area of the micro lens ML, the diameter thereof gradually increases as moving away from the center CP of the imaging region IR, while maintaining the shape of the micro lens ML in a substantially circular shape.

The pixel P-6 arranged at a position farther away from the center CP than the pixel P-1 on the straight line SL3 has a photoelectric conversion unit PD-6 and a micro lens ML-6. As viewed perspectively from a direction vertical to a light-receiving surface of the photoelectric conversion unit PD-6, the micro lens ML-6 includes the photoelectric conversion unit PD-6. The micro lens ML-6 has a substantially circular shape as viewed in a plan view. That is, the micro lens ML-6 has a substantially circular shape obtained by extending the shape of the micro lens ML-1 toward the center CP in the X direction and the Y direction, based on the shape of the micro lens ML-1. When it is assumed that a diameter of the micro lens ML-6 is D-6, the following Expression 19 is established.

$$D\text{-}6 > D\text{-}1 \qquad \text{Expression 19}$$

For example, as viewed perspectively from the direction vertical to the light-receiving surface of the photoelectric conversion unit PD-6, the center of the optical axis of the micro lens ML-6 can be shifted further toward the center CP from the barycenter of the photoelectric conversion unit PD-6, as compared with the pixel P-1. When it is assumed that a shift amount of the center of the optical axis of the micro lens ML-1 from the barycenter of the photoelectric conversion unit PD-1 is SF1, and a shift amount of the center of the optical axis of the micro lens ML-6 from the barycenter of the photoelectric conversion unit PD-6 is SF6, the following Expression 20 is established.

$$SF6 > SF1 \qquad \text{Expression 20}$$

According to Expression 20, because the center of the optical axis of the micro lens ML-6 is shifted toward the center CP, the micro lens ML-6 can easily collect incident light, which is incident obliquely, on the light-receiving surface of the photoelectric conversion unit PD-6. Further, because the micro lens ML-6 has a larger area than the micro lens ML-1, the amount of received light can be easily secured.

The pixel P-7 arranged at a position farther away from the center CP than the pixel P-6 on the straight line SL3 has a photoelectric conversion unit PD-7 and a micro lens ML-7. As viewed perspectively from a direction vertical to a light-receiving surface of the photoelectric conversion unit PD-7, the micro lens ML-7 includes the photoelectric conversion unit PD-7. The micro lens ML-7 has a substantially circular shape as viewed in a plan view. That is, the micro lens ML-7 has a substantially circular shape obtained by extending the shape of the micro lens ML-1 further toward the center CP than the micro lens ML-6 in the X direction and the Y direction, based on the shape of the micro lens ML-1. When it is assumed that a diameter of the micro lens ML-7 is D-7, the following Expression 21 is established.

$$D\text{-}7 > D\text{-}6 \qquad \text{Expression 21}$$

For example, as viewed perspectively from the direction vertical to the light-receiving surface of the photoelectric conversion unit PD-7, the center of the optical axis of the micro lens ML-7 can be shifted further toward the center CP from the barycenter of the photoelectric conversion unit PD-7, as compared with the pixel P-6. When it is assumed that a shift amount of the center of the optical axis of the micro lens ML-7 from the barycenter of the photoelectric conversion unit PD-7 is SF7, the following Expression 22 is established.

$$SF7 > SF6 \qquad \text{Expression 22}$$

According to Expression 22, because the center of the optical axis of the micro lens ML-7 is shifted toward the center CP, the micro lens ML-7 can easily collect incident light, which is incident obliquely, on the light-receiving surface of the photoelectric conversion unit PD-7. Further, because the micro lens ML-7 has a larger area than the micro lenses ML-1 and ML-6, the amount of received light can be easily secured.

It should be noted that, in the pixels arranged between the straight line SL3 and the straight line SL1 of the plurality of pixels, along with a change in the shape from the substantially circular shape to the substantially elliptical shape, the ratio of the length of the major axis to the length of the minor axis gradually increases as approaching from the straight line SL3 to the straight line SL1. Further, in the pixels arranged between the straight line SL3 and the straight line SL2 of the plurality of pixels, along with a change in the shape from the substantially circular shape to the substantially elliptical shape, the ratio of the length of the major axis to the length of the minor axis gradually increases as approaching from the straight line SL3 to the straight line SL2. Accordingly, a large total area of the plurality of micro lenses can be secured as viewed in a plan view (see FIG. 5 and FIG. 10B).

Effects of the present embodiment are explained next with reference to FIGS. 10A to 10C.

According to the present embodiment, in the imaging region IR, the plurality of micro lenses ML is extended toward the center CP and arranged with a larger area as moving away from the center CP of the imaging region IR as viewed in a plan view. Accordingly, in the imaging region IR, even when moving away from the center CP of the imaging region IR, attenuation of the amount of light collected in the photoelectric conversion unit. PD of the pixel P can be suppressed.

That is, as exemplified in the present embodiment as shown FIG. 10C, even when the position of the pixel is away from the center CP of the imaging region IR, as shown by white arrows, attenuation of the luminance level (a signal level) of the pixel signal generated by the photoelectric conversion unit PD of the pixel P can be suppressed. For example, an attenuation width ΔBL' of the luminance level of the pixel signals generated by the photoelectric conversion units PD of the surrounding pixels P with respect to the luminance level of the pixel signals generated by the photoelectric conversion units PD of the pixels P near the center CP can be considerably reduced as compared with an attenuation width ΔBL of the basic mode. As a result, in the image signal generated by the solid-state imaging apparatus 5, occurrence of shading in which the luminance of the pixel signals around the imaging region IR attenuates as compared with the luminance of the pixel signals near the center CP of the imaging region IR can be suppressed.

Furthermore, as shown in FIG. 10C, the luminance level of the pixel signals generated by the pixels P near the center CP of the imaging region IR in the present embodiment can be equivalent to the luminance level of the pixel signals generated by the pixels P near the center CP of the imaging region IR in the basic mode. As a result, in the imaging region IR, the luminance level of the pixel signals generated by the pixels P near the center CP can be maintained, and the luminance level of the pixel signals generated by the surrounding pixels P can be improved, thereby enabling to improve an average luminance level of the image signal.

As described above, according to the present embodiment, in the solid-state imaging apparatus 5, the pixel P-1 arranged near the center CP of the imaging region IR has the micro lens ML-1 having a substantially circular shape as viewed in a plan view. The pixel P-3 arranged at a position farther away from the center CP of the imaging region IR than the pixel P-1 has a substantially elliptical shape as viewed in a plan view, and has the micro lens ML-3 having a larger area than the micro lens ML-1. For example, the pixel P-3 is arranged at a position closer to the side SD1 than the pixel P-1 in the direction along the side SD2 of the imaging region IR. The micro lens ML-3 has a substantially elliptical shape extending in the direction along the side SD2 of the imaging region IR. Accordingly, the shift amount of the center of the optical axis of the micro lens ML-3 from the barycenter of the photoelectric conversion unit PD-3 can be increased toward the center CP as compared with the shift amount of the center of the optical axis of the micro lens ML-1 from the barycenter of the photoelectric conversion unit PD-1, thereby enabling to suppress attenuation of the amount of received light of the pixel P-3 with respect to that of the pixel P-1. Further, because the area of the micro lens ML-3 is larger than the area of the micro lens ML-1, attenuation of the amount of received light of the pixel P-3 with respect to the pixel P-1 can be further suppressed from this point of view. As a result, a difference in the amount of received light due to a difference between the incident angle of light to the pixel P-1 and the incident angle of light to the pixel P-3 can be reduced, and the amount of received light of the pixel P-3 can be approximated to the amount of received light of the pixel P-1. The structures of the pixel P-1 and the pixel P-3 are suitable for suppressing occurrence of shading, while improving the average luminance level in the image signal obtained by the solid-state imaging apparatus 5. That is, according to the present embodiment, the solid-state imaging apparatus 5 suitable for suppressing occurrence of shading, while improving the average luminance level in the image signal can be provided.

According to the present embodiment, in the solid-state imaging apparatus 5, the pixel P-2 positioned between the pixel P-1 and the pixel P-3 has the micro lens ML-2 having a substantially elliptical shape as viewed in a plan view and having a larger area than the micro lens ML-1 and a smaller area than the micro lens ML-3. Accordingly, the structure of the pixel P-2 can be made to correspond to a state where the value of the incident angle of light to the pixel P-2 is between the incident angle of light to the pixel P-1 and the incident angle of light to the pixel P-3. As a result, the difference in the amount of received light due to a difference between the incident angle of light to the pixel P-1, the incident angle of light to the pixel P-2, and the incident angle of light to the pixel P-3 can be reduced, respectively, and the amount of received light of the pixel P-2 can be approximated to the amount of received light of the pixel P-1.

According to the present embodiment, in the solid-state imaging apparatus 5, in the plurality of pixels P-1, P-1*a*, . . . , P-2, P-2*a*, . . . , P-3, and P-3*a* positioned on the straight line SL1 extending from the center CP of the imaging region IR in the direction along the side SD2 of the plurality of pixels, the shape of the micro lens ML changes from the substantially circular shape to the substantially elliptical shape, and along with a gradual increase in the area of the micro lens ML, the major axis thereof gradually increases as moving away from the center CP of the imaging region IR. Accordingly, for example in the X direction, even when the pixel position is away from the center CP of the imaging region IR, attenuation of the amount of received light can be suppressed, and occurrence of shading can be suppressed, while improving the average luminance level in the image signal obtained by the solid-stage imaging apparatus 5.

According to the present embodiment, in the solid-state imaging apparatus 5, in the plurality of pixels P-1, P-1*b*, . . . , P-4, P-4*b*, . . . , P-5, and P-5*b* positioned on the straight line SL2 extending from the center CP of the imaging region IR in the direction along the side SD1 of the plurality of pixels, the shape of the micro lens ML changes from the substantially circular shape to the substantially elliptical shape, and along with a gradual increase in the area of the micro lens ML, the major axis thereof gradually increases as moving away from the center CP of the imaging region IR. Accordingly, for example in the Y direction, even when the pixel position is away from the center CP of the imaging region IR, attenuation of the amount of received light can be suppressed, and occurrence of shading can be suppressed, while improving the average luminance level in the image signal obtained by the solid-stage imaging apparatus 5.

According to the present embodiment, in the solid-state imaging apparatus 5, in the plurality of pixels P-1, . . . , P-6, . . . , and P-7 positioned on the straight line SL3 extending in the direction approaching the corner CN1 from the center CP of the imaging region IR of the plurality of pixels, along with a gradual increase in the area of the micro lens ML, the diameter thereof gradually increases as moving away from the center CP of the imaging region IR (as approaching the corner CN1), while maintaining the shape of the micro lens ML in a substantially circular shape. Accordingly, for example in the direction intersecting with the X direction and the Y direction, even when the pixel position is away from the center CP of the imaging region IR, attenuation of the amount of received light can be suppressed, and occurrence of shading can be suppressed, while improving the average luminance level in the image signal obtained by the solid-stage imaging apparatus 5.

According to the present embodiment, in the solid-state imaging apparatus 5, in the plurality of pixels arranged between the straight line SL3 and the straight line SL1 of the plurality of pixels, along with a change in the shape from the substantially circular shape to the substantially elliptical shape, the ratio of the major axis to the minor axis gradually increases as approaching from the straight line SL3 to the straight line SL1. Further, in the pixels arranged between the straight line SL3 and the straight line SL2 of the plurality of pixels, along with a change in the shape from the substantially circular shape to the substantially elliptical shape, the ratio of the major axis to the minor axis gradually increases as approaching from the straight line SL3 to the straight line SL2. Accordingly, the respective structures of the plurality of pixels can be made suitable for the pixel position, and occurrence of shading in the image signal obtained by the solid-state imaging apparatus 5 can be suppressed, while securing the total area of the plurality of micro lenses in a plan view.

It should be noted that, although according to the present embodiment, a region taken in a +X direction and a +Y direction (a first quadrant region) based on the center CP in the imaging region IR has been explained as an example, a second quadrant region, a third quadrant region, and a fourth quadrant region can be also formed by folding back the first quadrant region symmetrically. Therefore, explanations thereof will be omitted.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A solid-state imaging apparatus having an imaging region in which a plurality of pixels are two-dimensionally arranged,
    the plurality of pixels including
    a first pixel arranged near a center of the imaging region, and
    a second pixel arranged at a position farther away from the center of the imaging region than the first pixel,
    the first pixel including a first micro lens having a substantially circular shape as viewed in a plan view, and
    the second pixel including a second micro lens having a substantially elliptical shape as viewed in a plan view and having an area larger than an area of the first micro lens,
    the imaging region having a rectangular shape and having a first side and a second side that is adjacent to the first side,
    the second pixel being arranged at a position closer to the first side than the first pixel in a direction along the second side, and
    the second micro lens having a substantially elliptical shape in a direction along with second side,
    the plurality of pixels further including a third pixel positioned between the first pixel and the second pixel, and
    the third pixel having a third micro lens, the third micro lens having a substantially elliptical shape as viewed in a plan view and having an area larger than the area of the first micro lens and smaller than the area of the second micro lens.

2. The solid-state imaging apparatus according to claim 1, wherein
    the second micro lens has a substantially elliptical shape in a direction along the second side.

3. The solid-state imaging apparatus according to claim 2, wherein
    a length of a major axis of the third micro lens is larger than a diameter of the first micro lens and smaller than a length of a major axis of the second micro lens.

4. The solid-state imaging apparatus according to claim 1, wherein
    the plurality of pixels further include a fourth pixel arranged at a position closer to the second side than the first pixel in a direction along the first side,
    the fourth pixel has a fourth micro lens having a substantially elliptical shape as viewed in a plan view and having a fourth micro lens having an area larger than the area of the first micro lens, and
    the fourth micro lens has a substantially elliptical shape extending in a direction along the first side.

5. The solid-state imaging apparatus according to claim 4, wherein
    a length of a major axis of the fourth micro lens is larger than a diameter of the first micro lens.

6. The solid-state imaging apparatus according to claim 4, wherein
    the plurality of pixels further include a fifth pixel positioned between the first pixel and the fourth pixel, and
    the fifth pixel has a fifth micro lens having a substantially elliptical shape as viewed in a plan view and having an area larger than the area of the first micro lens and smaller than the area of the fourth micro lens.

7. The solid-state imaging apparatus according to claim 6, wherein
    the fifth micro lens has a substantially elliptical shape extending in a direction along the first side.

8. The solid-state imaging apparatus according to claim 7, wherein
    a length of a major axis of the fifth micro lens is larger than a diameter of the first micro lens and smaller than a diameter of the fourth micro lens.

9. The solid-state imaging apparatus according to claim 1, wherein
    the imaging region further includes a first corner at which the first side and the second side intersect with each other,
    the plurality of pixels further include a sixth pixel arranged at a position closer to the first corner than the first pixel, and
    the sixth pixel has a sixth micro lens having a substantially circular shape as viewed in a plan view and having an area larger than the area of the first micro lens.

10. The solid-state imaging apparatus according to claim 9, wherein
    a diameter of the sixth micro lens is larger than a diameter of the first micro lens.

11. The solid-state imaging apparatus according to claim 9, wherein
    the plurality of pixels further include a seventh pixel positioned between the first pixel and the sixth pixel, and
    the seventh pixel has a seventh micro lens having a substantially circular shape as viewed in a plan view and having an area larger than the area of the first micro lens and smaller than the area of the sixth micro lens.

12. The solid-state imaging apparatus according to claim 11, wherein
    a diameter of the seventh micro lens is larger than a diameter of the first micro lens and smaller than a diameter of the sixth micro lens.

13. A solid-state imaging apparatus having an imaging region in which a plurality of pixels are two-dimensionally arranged,
    the plurality of pixels including
    a first pixel arranged near a center of the imaging region, and
    a second pixel arranged at a position farther away form the center of the imaging region than the first pixel,
    the first pixel including a first micro lens having a substantially circular shape as viewed in a plan view, and
    the second pixel including a second micro lens, the second micro lens having a substantially elliptical shape as viewed in a plan view and having an area larger than an area of the first micro lens,
    the imaging region having a rectangular shape and having a first side and a second side that is adjacent to the first side,
    the second pixel being arranged at a position closer to the first side than the first pixel in a direction along the second side, and the second micro lens having a substantially elliptical shape in a direction along the second side, among the plurality of pixels, in pixels positioned on a straight line extending in a direction along the second side from the center of the imaging region, lengths of major axes of the micro lenses increasing moving away from the center of the imaging region.

14. The solid-state imaging apparatus according to claim 13, wherein, among the plurality of pixels, in pixels positioned on a straight line extending in a direction along the second side from the center of the imaging region, areas of the micro lenses increase as moving away from the center of the imaging region.

15. The solid-state imaging apparatus according to claim 13, wherein, among the plurality of pixels, in pixels positioned on a straight line extending in a direction along the first side from the center of the imaging region, lengths of major axes of the micro lenses increase as moving away from the center of the imaging region.

16. The solid-state imaging apparatus according to claim 15, wherein, among the plurality of pixels, in pixels positioned on a straight line extending in the direction along the first side from the center of the imaging region, areas of the micro lenses increase as moving away from the center of the imaging region.

* * * * *